US012733327B2

(12) United States Patent
Fukui et al.

(10) Patent No.: US 12,733,327 B2
(45) Date of Patent: Sep. 8, 2026

(54) LIGHT EMITTING ELEMENT

(71) Applicant: NICHIA CORPORATION, Anan (JP)

(72) Inventors: Yoshinori Fukui, Tokushima (JP); Shun Kitahama, Tokushima (JP); Yoshiki Inoue, Anan (JP)

(73) Assignee: NICHIA CORPORATION, Anan (JP)

( * ) Notice: Subject to any disclaimer, the term of this patent is extended or adjusted under 35 U.S.C. 154(b) by 435 days.

(21) Appl. No.: 18/536,867

(22) Filed: Dec. 12, 2023

(65) Prior Publication Data

US 2024/0213298 A1 Jun. 27, 2024

(30) Foreign Application Priority Data

Dec. 22, 2022 (JP) ................................ 2022-206072

(51) Int. Cl.
*H01L 27/15* (2006.01)
*H10H 29/14* (2025.01)

(52) U.S. Cl.
CPC ................................ *H10H 29/142* (2025.01)

(58) Field of Classification Search
CPC .... H10H 29/142; H10H 20/857; H10W 90/00
See application file for complete search history.

(56) References Cited

U.S. PATENT DOCUMENTS 11,489,089 B2 * 11/2022 Kuo .................... H10H 20/813
2011/0079798 A1 4/2011 Ogihara
2012/0182738 A1 * 7/2012 Jeong .................. H10H 29/142 362/249.02
2013/0049053 A1 2/2013 Kususe et al.
2013/0306997 A1 * 11/2013 Lim .................... H10H 29/142 438/34
2015/0014716 A1 1/2015 Von Malm
2016/0149085 A1 5/2016 Kashimoto et al.
2016/0247855 A1 8/2016 Von Malm
2016/0326859 A1 11/2016 Crews et al.
2017/0084787 A1 * 3/2017 Emura .............. H10H 20/8316

(Continued)

FOREIGN PATENT DOCUMENTS

JP 2008-282930 A 11/2008
JP 2011-077447 A 4/2011

(Continued)

*Primary Examiner* — Thao P Le
(74) *Attorney, Agent, or Firm* — Foley & Lardner LLP

(57) ABSTRACT

A light emitting element includes: a first semiconductor layer; light emitting cells disposed on the first semiconductor layer, each including: an active layer, and a second semiconductor layer disposed on the active layer, wherein the light emitting cells include a first light emitting cell positioned in a center, and a plurality of second light emitting cells positioned around the first light emitting cell; a first insulation layer having a first opening provided above the first semiconductor layer located outward from the second light emitting cells and a plurality of second openings located above each second semiconductor layer; a first electrode disposed on the first insulation layer and electrically connected to the first semiconductor layer at the first opening; and a plurality of second electrodes, each positioned on and electrically connected to a respective one of the second semiconductor layers at a respective one of the second openings.

16 Claims, 3 Drawing Sheets

(56) References Cited

U.S. PATENT DOCUMENTS

| | | | | |
|---|---|---|---|---|
| 2017/0186914 | A1* | 6/2017 | Kitahama | H10H 20/832 |
| 2017/0186915 | A1* | 6/2017 | Emura | H10H 20/835 |
| 2017/0247995 | A1 | 8/2017 | Crews et al. | |
| 2017/0352700 | A1 | 12/2017 | Von Malm | |
| 2019/0267527 | A1* | 8/2019 | Emura | H10H 29/142 |
| 2020/0141215 | A1 | 5/2020 | Crews et al. | |
| 2020/0212278 | A1 | 7/2020 | Takenaga et al. | |
| 2020/0321492 | A1* | 10/2020 | Kitahama | H10H 20/831 |
| 2022/0246815 | A1 | 8/2022 | Furuha et al. | |
| 2022/0254960 | A1 | 8/2022 | Furuha | |
| 2022/0336719 | A1 | 10/2022 | Inazu | |
| 2023/0145007 | A1* | 5/2023 | Basrur | H10H 20/8312 257/79 |
| 2024/0266384 | A1* | 8/2024 | Sim | H10H 29/142 |

FOREIGN PATENT DOCUMENTS

| | | | |
|---|---|---|---|
| JP | 2014-044971 | A | 3/2014 |
| JP | 2014-150140 | A | 8/2014 |
| JP | 2015-501085 | A | 1/2015 |
| JP | 2015-133386 | A | 7/2015 |
| JP | 2016-100489 | A | 5/2016 |
| JP | 2020-107819 | A | 7/2020 |
| JP | 2022-119710 | A | 8/2022 |
| JP | 2022-121373 | A | 8/2022 |
| JP | 2022-165750 | A | 11/2022 |

* cited by examiner

LIGHT EMITTING ELEMENT

CROSS-REFERENCE TO RELATED APPLICATIONS

This application is based on and claims priority to Japanese Patent Application No. 2022-206072, filed on Dec. 22, 2022, the entire contents of which are incorporated herein by reference.

FIELD

The present invention relates to a light emitting element.

BACKGROUND

Japanese Patent Publication No. 2015-501085 discloses a display device which individually drives the pixels provided on a carrier. In the case of driving such a display device, it is occasionally difficult to achieve a desired emission intensity distribution.

SUMMARY

An object of an embodiment of the present invention is to provide a light emitting element that can achieve a desired emission intensity distribution.

A light emitting element according to one embodiment of the present invention includes: a first semiconductor layer; a plurality of light emitting cells disposed on the first semiconductor layer along a first direction and including an active layer and a second semiconductor layer disposed on the active layer, the light emitting cells including a first light emitting cell positioned in the center among the light emitting cells and a plurality of second light emitting cells positioned around the first light emitting cell; a first insulation layer continuously disposed over the light emitting cells and having a first opening provided above the first semiconductor layer located outward from the second light emitting cells in the first direction and a plurality of second openings provided above the second semiconductor layer in each of the light emitting cells; a first electrode disposed on the first insulation layer and electrically connected to the first semiconductor layer at the first opening; and second electrodes individually positioned on the second semiconductor layer in each of the light emitting cells and electrically connected to the second semiconductor layer at the second openings.

An embodiment of the present invention can provide a light emitting element that can achieve a desired emission intensity distribution.

DETAILED DESCRIPTION

Figure 1:
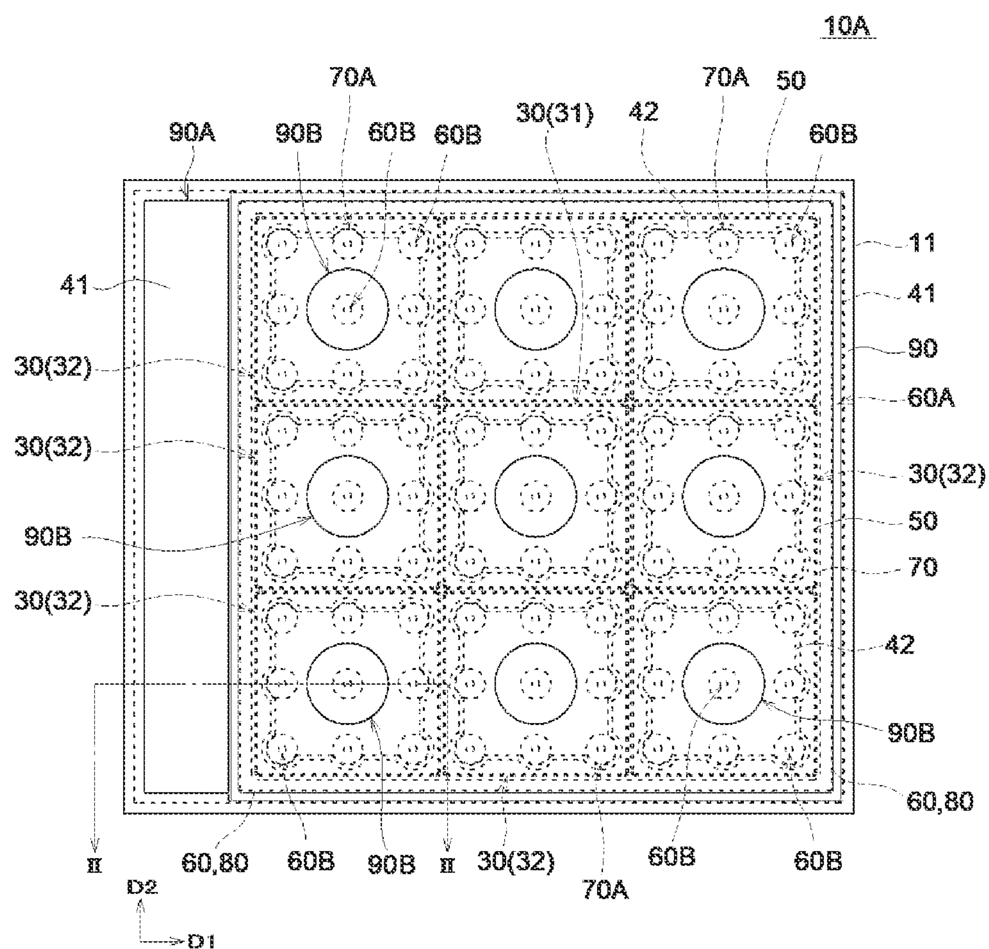
FIG. 1 is a schematic top view of a light emitting element according to a first embodiment.

Light emitting elements and light emitting devices according to certain embodiments will be explained below with reference to the accompanying drawings. The sizes or positional relationships of the members in the drawings might be exaggerated for clarity of explanation. The dimensions or layout of the members in a plan view might not strictly match those in a corresponding cross-sectional view. Certain elements might be omitted in a drawing or an end face view showing only a cut section might be used as a cross-sectional view so as not to make the drawing excessively complex. In the explanation below, furthermore, the terms such as upper/above and lower/under describe are used to describe something relative, and are not intended to indicate absolute directions. The same designations and reference numerals basically denote the same members or those of similar quality for which a detailed explanation might be omitted as appropriate. The term “cover” or “covering” as used in the present application is not limited to the case in which one directly covers another, but includes the case in which one indirectly covers another, for example, via another member.

First Embodiment

Figure 2:
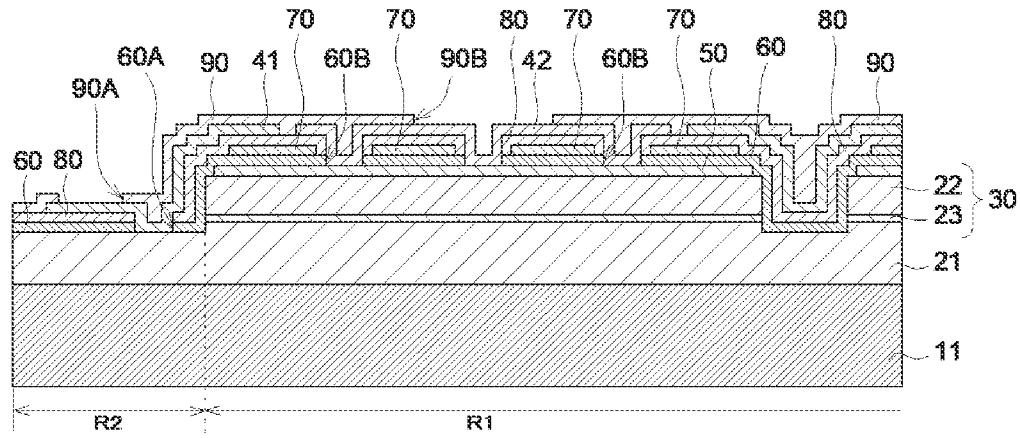
FIG. 2 is a schematic cross-sectional view of the light emitting element according to the first embodiment taken along line II-II in FIG. 1.

A light emitting element 10A according to a first embodiment will be explained with reference to FIG. 1 and FIG. 2. FIG. 1 is a schematic top view of the structure of the light emitting element 10A of this embodiment. FIG. 2 is a schematic cross-sectional view of the light emitting element 10A taken along line II-II in FIG. 1.

As shown in FIG. 2, the light emitting element 10A includes: a first semiconductor layer 21; a plurality of light emitting cells 30 disposed on the first semiconductor layer 21 along a first direction D1 and including an active layer 23 and a second semiconductor layer 22 disposed on the active layer 23, the light emitting cells 30 including a first light emitting cell 31 positioned in the center among the light emitting cells 30 and a plurality of second light emitting cells 32 positioned around the first light emitting cell 31; a first insulation layer 60 continuously disposed over the light emitting cells 30 and having a first opening 60A provided above the first semiconductor layer 21 located outward from the second light emitting cells 32 in the first direction D1 and a plurality of second openings 60B provided above the second semiconductor layer 22 in each of the light emitting cells 30; a first electrode 41 disposed on the first insulation layer 60 and electrically connected to the first semiconductor layer 21 at the first opening 60A; and second electrodes 42 individually positioned on the second semiconductor layer 22 in each of the light emitting cells 30 and electrically connected to the second semiconductor layer 22 at the second openings 60B.

As shown in FIG. 1 and FIG. 2, the light emitting element 10A has a substrate 11, a first semiconductor layer 21 disposed on the substrate 11, and a plurality of light emitting cells 30 disposed on the first semiconductor layer 21. The light emitting cells 30 each include an active layer 23 and a second semiconductor layer 22 disposed on the active layer 23. The active layer 23 is positioned between the first semiconductor layer 21 and the second semiconductor layer 22. The first semiconductor layer 21 has, for example, a semiconductor layer containing an n-type impurity. The second semiconductor layer 22 has, for example, a semiconductor layer containing a p-type impurity.

The upper face of the first semiconductor layer 21 has a first region R1 in which the light emitting cells 30 are disposed and a second region R2 adjacent to the first region R1 in the first direction D1. A first electrode 41 is electrically connected to the first semiconductor layer 21, and a second electrode 42 is electrically connected to the second semiconductor layer 22. Applying a forward voltage across the first electrode 41 and the second electrode 42 allows the active layer 23 in each light emitting cell to emit light. The light emitted by the active layer 23 is extracted primarily from the lower face and the lateral faces of the substrate 11.

As shown in FIG. 1, the light emitting cells 30 are arranged in a matrix along the first direction D1 and the second direction D2. The second direction D2 is orthogonal to the first direction D1. The light emitting cells 30 include a first light emitting cell 31 positioned in the center among the light emitting cells 30 and a plurality of second light emitting cells 32 positioned around the first light emitting cell 31. The light emitting element 10A has one first light emitting cell 31 and eight second light emitting cells 32. In this embodiment, the form having nine light emitting cells 30 is illustrated, but the number of light emitting cells 30 is not limited to this. For example, the light emitting cells 30 may be arranged in a matrix of 4 to 10 pieces in the first direction D1 and 4 to 10 pieces in the second direction D2. Furthermore, the form is not limited to one having a single first light emitting cell 31, and multiple first light emitting cells 31 may be provided. For example, among the light emitting cells 30 arranged in 5 rows and 5 columns, those arranged in the 3 rows and 3 columns located in the center of the matrix can be first light emitting cells 31, and the sixteen light emitting cells among those arranged in 5 rows and 5 columns that are positioned in the periphery of the first light emitting cells 31 can be second light emitting cells 32. Another form may have one first light emitting cell 31 and two second light emitting cells 32 arranged along the first direction D1. In this case, the first light emitting cell 31 is interposed between the two second light emitting cells 32 in the first direction D1. In the present specification, the second light emitting cells 32 in such a form are also included as the light emitting cells 30 that are positioned around the first light emitting cell 31.

The top view shape of a light emitting cell 30 is, for example, rectangular. In a top view, the shape of a light emitting cell 30 can be, for example, a square each side being 100 μm to 500 μm. In the top view, the distance between two adjacent light emitting cells 30 can be in a range, for example, from 1 μm to 10 μm.

For the substrate 11, an insulation substrate, such as sapphire using C-plane, R-plane, or A-plane as a primary plane, or spinel ($MgAl_2O_4$) can be used. In the case of epitaxially growing a semiconductor layer made of a nitride semiconductor, C-plane sapphire substrate is preferably used. For the substrate 11, SiC (including 6H, 4H, and 3C SiC), ZnS, ZnO, GaAs, Si, or the like may be used. The top view shape of the substrate 11 may be rectangular. The length of a side of the substrate 11 is in a range, for example, from 100 μm to 2000 μm, preferably 500 μm to 1000 μm. The substrate 11 does not have to be included.

For the light emitting element 10A, a light emitting diode (LED) is preferably used. For the light emitting diode, one that emits light of any wavelength can be selected. For example, for a blue or green light emitting diode, one using ZnSe, nitride based semiconductor, or GaP can be used. Nitride semiconductors include semiconductors of all compositions obtained by varying the composition ratio x and y within their ranges in the chemical formula $In_xAl_yGa_{1-x-y}N$ ($0 \leq x \leq 1$, $0 \leq y \leq 1$, $x+y \leq 1$).

As shown in FIG. 2, a light transmissive conductive layer 50 is disposed on the second semiconductor layer 22 of each light emitting cell 30 and electrically connected to the second semiconductor layer 22. The light transmissive conductive layer 50 preferably has high light transmissivity with respect to the wavelength of the light from the active layer 23. For the light transmissive conductive layer 50, for example, indium oxide containing tin (indium tin oxide, ITO) or zinc oxide containing indium (indium zinc oxide, IZO) can be used.

As shown in FIG. 1 and FIG. 2, a first insulation layer 60 is continuously disposed over the light emitting cells 30. The first insulation layer 60 is disposed between the light transmissive conductive layer 50 and the first electrode 41 in part, and between the light transmissive conductive layer 50 and the second electrode 42 in part. The first insulation layer 60 continuously covers the light transmissive conductive layer 50, the upper face and the lateral faces of the light emitting cells 30, and the upper face of the first semiconductor layer 21. The first insulation layer 60 continuously covers the first semiconductor layer 21 across the first region R1 and the second region R2.

As shown in FIG. 1 and FIG. 2, the first insulation layer 60 has a first opening 60A above the first semiconductor layer 21 located outward from the second light emitting cells 32 in the first direction D1 and a plurality of second openings 60B provided above the second semiconductor layer 22 in each of the light emitting cells 30. The first semiconductor layer 21 is exposed at the first opening 60A, and the light transmissive conductive layer 50 is exposed at the second openings 60B. For the first insulation layer 60, for example, silicon oxide or silicon nitride can be used.

In a top view, the first opening 60A is provided to surround the light emitting cells 30, for example. In this embodiment, in the top view, nine light emitting cells 30 are surrounded by a single first opening 60A. In the first direction D1 or the second direction D2, the width of the first opening 60A can be in a range, for example, from 5 μm to 20 μm. Nine second openings 60B are provided in each light emitting cell 30. In the top view, the second openings 60B provided in each light emitting cell 30 are located at equal intervals, and the layout of the second openings 60B is the same in every light emitting cell 30. The top view shape of each second opening 60B can be, for example, circular or elliptical. The second openings 60B can have the same top view shape.

The first insulation layer 60 can have a single layer or multilayer structure employing a dielectric layer selected from silicon oxide, niobium oxide, zirconium oxide, silicon nitride, and the like. The first insulation layer 60 may be a dielectric multilayer film including multiple dielectric layers designed to reflect the light from the active layer 23. For the first insulation layer 60, a dielectric multilayer made by alternately stacking, for example, silicon oxide layers and niobium oxide layers may be used. This allows the first insulation layer 60 to reflect the oncoming light from the active layer 23 towards the first semiconductor layer 21, thereby improving the light extraction efficiency of the light emitting element 10A. Furthermore, disposing a first insulation layer 60 including such a dielectric multilayer film to cover the lateral faces of the light emitting cells 30 can reduce the propagation of the light from a lit light emitting cell 30 to an adjacent light emitting cell 30 when the light emitting cells 30 are individually ON/OFF controlled. This can increase the difference between the luminance of a lit light emitting cell 30 and the luminance of an unlit light emitting cell 30, thereby improving the contrast ratio of the light emitting element 10A.

As shown in FIG. 1 and FIG. 2, a reflecting layer 70 is disposed on the first insulation layer 60 in each light emitting cell 30. The reflecting layer 70 is disposed between the first insulation layer 60 and the cover layer 80 described below. The reflecting layer 70 may be disposed between the first insulation layer 60 and the cover member 80 located in the second region R2. The reflecting layer 70 preferably has a higher reflectance than those of the first electrode 41 and the second electrode 42 with respect to the peak wavelength of the light from the active layer 23. When provided, the reflecting layer 70 can reflect the portion of the light from the active layer 23 that passed through the first insulation layer 60 and reached the reflecting layer 70 towards the first semiconductor layer 21, thereby improving the light extraction efficiency of the light emitting element 10A. For the reflecting layer 70, for example, a metal such as Al, Ag, or an alloy made of these can be used. The reflecting layer 70 can have a single layer structure, but may have a multilayer structure that includes an adhesion layer on a metal, such as Al, Ag, or an alloy thereof, for enhancing the adhesion with the cover layer 80 described below. For the adhesion layer, for example, Ti or Ni can be used.

The reflecting layer 70 has openings 70A corresponding to the regions overlapping the second openings 60B in a top view. In the top view, the area of an opening 70 is larger than the area of a second opening 60B. The top view shape of an opening 70A can be, for example, circular or elliptical. The openings 70A can have the same top view shape.

A cover layer 80 is disposed to cover the reflecting layer 70 and the first insulation layer 60. The cover layer 80 has an opening that overlaps the first opening 60A of the first insulation layer 60. For the cover layer 80, for example, silicon oxide or silicon nitride can be used.

A first electrode 41 is disposed on the first insulation layer 60 and electrically connected to the first semiconductor layer 21 at the first opening 60A. The first electrode 41 is continuously disposed over the first region R1 and the second region R2 of the first semiconductor layer 21. The first electrode 41 is disposed between the light emitting cells 30 in a matrix when viewed from above. The first electrode 41 is electrically connected to the first semiconductor layer 21 only at the first opening 60A, and is not electrically connected to the first semiconductor layer 21 located between the light emitting cells 30. This can reduce the unevenness of the emission intensity distribution that would otherwise occur as a result of connecting the first electrode 41 to the first semiconductor layer 21 located between the light emitting cells 30. For the first electrode 41, for example, a metal material, such as Ti, Rh, Pt, Ru, Au or the like can be used. In the first opening 60A, there might be a region where the first electrode 41 and the first semiconductor layer 21 are not fully contacting one another to the extent that the contact area is ensured for the first electrode 41 and the first semiconductor layer 21.

In a top view, the first electrode 41 continuously covers the peripheral part of each of the light emitting cells 30. This allows the first electrode 41 to reflect or absorb the light propagating from one light emitting cell to adjacent light emitting cells 30 when multiple light emitting cells are lit. This can increase the difference between the luminance of a lit light emitting cell 30 and the luminance of an unlight emitting cell 30 when ON/OFF controlling multiple light emitting cells 30, there by improving the contrast ratio of the light emitting element 10A.

A second electrode 42 is disposed on the second semiconductor layer 22 in each of the light emitting cells 30 and is electrically connected to the light transmissive conductive layer 50 at multiple second openings 60B. The second electrode 42 is electrically connected to the second semiconductor layer 22 via the light transmissive conductive layer 50. The first insulation layer 60, the reflective layer 70, and the cover layer 80 are interposed between the second electrode 42 and the light transmissive conductive layer 50 at some locations. For the second electrode 42, for example, a metal material similar to that for the first electrode 41 can be used.

A second insulation layer 90 is continuously disposed over the first electrode 41, the second electrode 42, and the cover layer 80. The second insulation layer 90 has a fourth opening 90B above the second electrode 42 in each of the light emitting cells 30, and a third opening 90A above the first electrode 41 located in the second region R2. The first electrode 41 is exposed at the third opening 90A, and each second electrode 42 is exposed at a fourth opening 90B. In a top view, the shape of the third opening 90A is rectangular having longer sides in the second direction D2 than those in the first direction D1. In the top view, each fourth opening 90B is positioned in the central region of each light emitting cell 30. In the top view, the area of a fourth opening 90B is larger than the area of a second opening 60B. The top view shape of each fourth opening 90B can be, for example, circular or elliptical. The fourth openings 90B can have the same top view shape. For the second insulation layer 90, for example, a similar material to that for the first insulation layer 60 can be used.

As described above, the first electrode 41 of the light emitting element 10A is electrically connected to the first semiconductor layer 21 at the first opening 60A located outward from the second light emitting cells 32 that surround the first light emitting cell 31. This can reduce the unevenness in the emission intensity distribution that could be caused by connecting the first electrode 41 to the first semiconductor layer 21 located between the light emitting cells 30, thereby achieving a desired emission intensity when ON/OFF controlling the light emitting cells 30 individually.

Second Embodiment

A light emitting element 10B according to a second embodiment will be explained with reference to FIG. 3.

Figure 3:
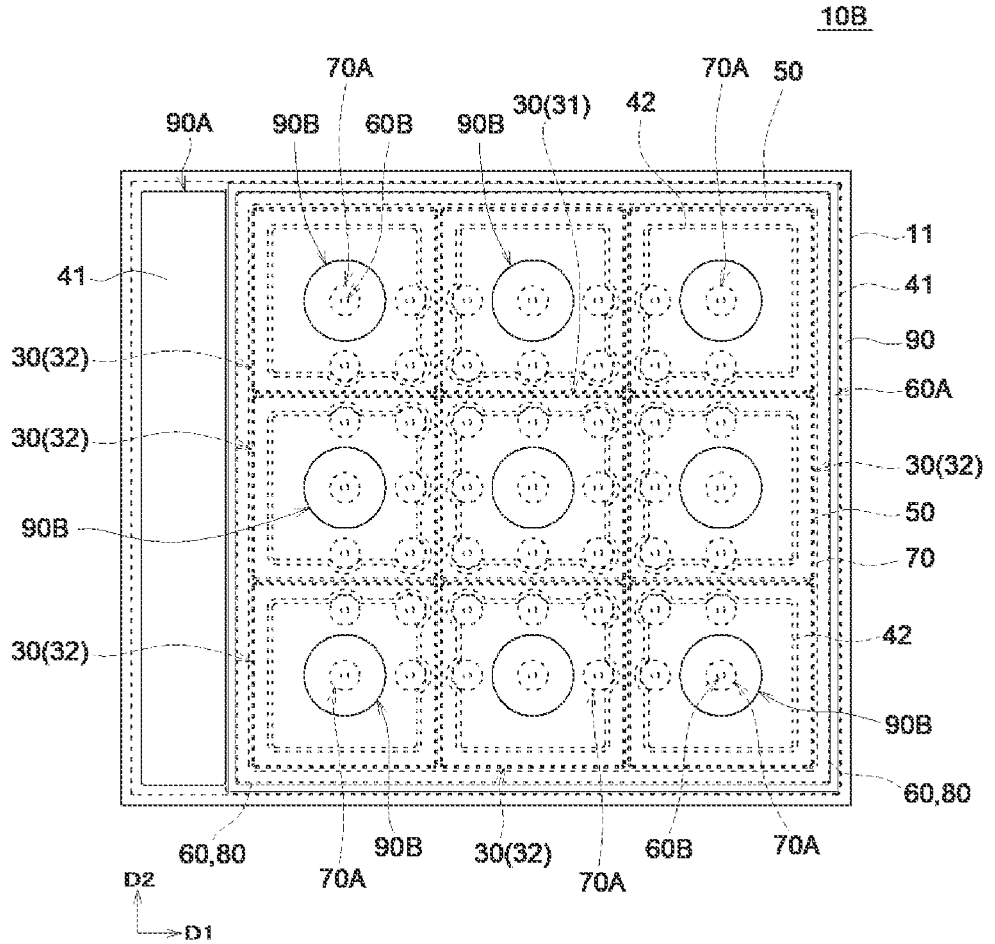
FIG. 3 is a schematic top view of a light emitting element according to a second embodiment.

The light emitting element 10B, as shown in FIG. 3, primarily differs from the light emitting element 10A in terms of the layout of the second openings 60B in each light emitting cell 30, and the layout of the other constituent members are modified in accordance with the changed layout of the second openings 60B. In the explanation below, the same constituents as those in FIG. 1 are denoted by the same reference numerals for which the explanation is omitted.

In this embodiment, in a top view, the second openings 60B provided in the second light emitting cells 32 are concentrated around the first light emitting cell 31. In the top view, for example, the second openings 60B of the second light emitting cells 32 are not positioned within a predetermined distance range from the first opening 60A. In other words, in the top view, the second openings 60B of the second light emitting cells 32 are arranged while keeping at least a predetermined distance from the first opening 60A. Here, in the case of having the first electrode 41 electrically connected to the first semiconductor layer 21 only at the first opening 60A located outward from the light emitting cells 30, the regions of the second light emitting cells 32 that are close to the first opening 60A might have higher emission intensity to cause an uneven emission intensity distribution. Employing the layout of the second openings 60B described above can lessen the concentration of high intensity emission in the regions of the second light emitting cells 32 that are located close to the first opening 60A thereby achieving a desired emission intensity distribution for the light emitting element 10B. This can particularly moderate an uneven emission intensity distribution in the first light emitting cell 31 when only the first light emitting cell 31 is lit, as well as moderating an uneven emission intensity distribution when all of the light emitting cells 31 and 32 are lit. The predetermined distance can be in a range, for example, from 40% to 60% of the length of a side of a light emitting cell 30.

The number of second openings 60B provided in a second light emitting cell 32 is less than the number of second openings 60B provided in a first light emitting cell 31. This can supply electric current more readily to the first light emitting cell 31 than to the second light emitting cells 32, thereby reducing the concentration of higher emission intensity in the regions of the second light emitting cells 32 that are closer to the first opening 60A.

Third Embodiment

A light emitting element 10C according to a third embodiment will be explained with reference to FIG. 4.

Figure 4:
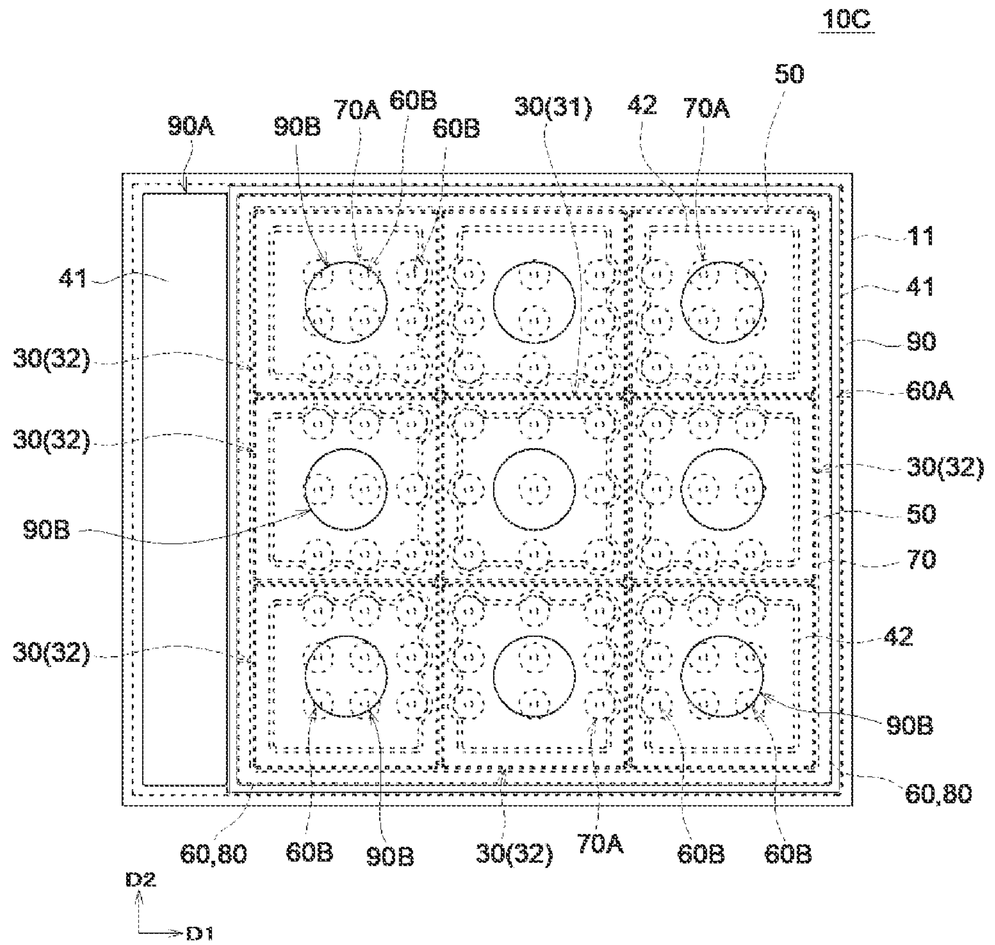
FIG. 4 is a schematic top view of a light emitting element according to a third embodiment.

The light emitting element 10C, as shown in FIG. 4, primarily differs from the light emitting element 10A in terms of the layout of the second openings 60B in each light emitting cell 30, and the layout of the other constituent members are modified in accordance with the changed layout of the second openings 60B. In the explanation below, the same constituents as those in FIG. 1 are denoted by the same reference numerals for which the explanation is omitted.

The same number of second openings 60B are provided in each of the first light emitting cell 31 and the second light emitting cells 32. Moreover, the area of a second opening provided in the first light emitting cell 31 and the second light emitting cells 32 is the same.

Similar to the light emitting element 10B of the second embodiment, in a top view, the locations of the second openings 60B of the second light emitting cells 32 are concentrated near the first light emitting cell 31. In a top view, for example, the second openings 60B of the second light emitting cells 32 are not positioned within a predetermined distance range from the first opening 60A. In other words, in the top view, the second openings 60B of the second light emitting cells 32 are arranged while keeping at least a predetermined distance from the first opening 60A. Employing such a layout for the second openings 60B can reduce the concentration of high intensity emission of the light emitting element 10C in the regions of the second light emitting cells 32 near the first opening 60A thereby achieving a desired emission intensity distribution. This can particularly moderate an uneven emission intensity distribution in the first light emitting cell 31 when only the first light emitting cell 31 is lit, as well as moderating an uneven emission intensity distribution when all of the light emitting cells 31 and 32 are lit. The predetermined distance can be in a range, for example, from 10% to 30% of the length of a side of a light emitting cell 30.

In the first direction D1, the distance between two adjacent second openings 60B among those provided in the second light emitting cells 32 except for the second light emitting cells located in the same column as the first light emitting cell 31 is less than the distance between two adjacent second openings 60B provided in the first light emitting cell 31. This can locate the second openings 60B to be concentrated near the first light emitting cell 31 while securing the contact area between the second electrode 42 and the light transmissive conductive layer 50. This, as a result, can reduce the concentration of high intensity emission near the first opening 60A in the emission intensity distribution in the first direction D1 while reducing the degradation of drive voltage.

In the second direction D2, the distance between two adjacent second openings 60B among those provided in the second light emitting cells 32 except for the second light emitting cells located in the same row as the first light emitting cell 31 is less than the distance between two adjacent second openings 60B provided in the first light emitting cell 31. This can locate the second openings 60B to be concentrated near the first light emitting cell 31 while securing the contact area between the second electrode 42 and the light transmissive conductive layer 50. This, as a result, can reduce the concentration of high intensity emission near the first opening 60A in the emission intensity distribution in the first direction D2 while reducing the degradation of drive voltage.

Light Emitting Device 100

Figure 5:
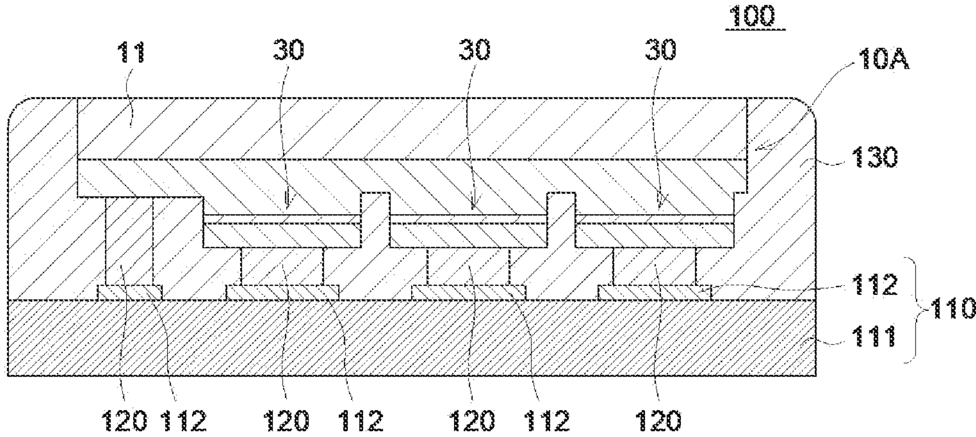
FIG. 5 is a schematic cross-sectional view of a light emitting device according to an embodiment of the present invention.

A light emitting device 100 using a light emitting element 10A will be explained with reference to FIG. 5. FIG. 5 is a schematic cross-sectional view of the light emitting device 100.

As shown in FIG. 5, the light emitting device 100 has a support substrate 110, a light emitting element 10A disposed on the support substrate 110, and a reflecting member 130 disposed around the light emitting element 10A. The support substrate 110 has a base 111 and a plurality of conductive terminals 112 disposed on the base 111. The light emitting element 10A is electrically connected to the conductive terminals 112 disposed on the support substrate 110 via a bonding material 120.

The first electrode 41 exposed at the third opening 90A is electrically connected to the conductive terminal 112 disposed on the support substrate 110 via the bonding material 120. The second electrode 42 exposed at the fourth opening 90B in each light emitting cell 30 is electrically connected to the conductive terminal 112 disposed on the support substrate 110 via the bonding material 120. The light emitting element 10A is electrically connected to the support substrate 110 such that the light emitting cells 30 can be individually ON/Off controlled.

The top view shape of the base 111 is, for example, rectangular. For the base 111, for example, a silicon, SiC, or GaN substrate can be used. For the conductive terminals 112, for example, metals such as Cu, Ag, Au, Al, Pt, Ti, W, Pd, Fe, Ni, or their alloys can be used. For the support substrate 110, for example, an integrated circuit (IC) substrate in which the circuits for controlling the operations of the light emitting cells 30 are integrated can be used. The light emitting cells 30 are individually ON/OFF controlled by a control unit electrically connected to the integrated circuit substrate, for example.

When electrically connecting the light emitting element 10A and the support substrate 110, bumps made of a metal material, such as Au, Ag, Cu, Al, or the like can be used as the bonding material 120. Alternatively, a solder material, such as lead free AuSn-based or Sn-based solder, may be used for the bonding material 120. For the bonding material 120, a conductive bonding material made of a resin containing conductive particles can also be used. The light emitting element 10A and the support substrate 110 may be bonded by directly bonding the electrodes of the light emitting element 10A and the conductive terminals 112 of the support substrate 110.

As shown in FIG. 5, a reflecting member 130 covers the upper face and the lateral faces of the light emitting element 10A and the upper face of the support substrate 110. The lower face of the substrate 11 is exposed from the reflecting member 130. The reflecting member 130 is disposed between the light emitting element 10A and the support substrate 110. The reflecting member 130 is also disposed between the light emitting cells 30. The reflecting member 130 reflects the outgoing light from the light emitting element 10A towards the lower face of the substrate 11 to thereby increase the light extraction efficiency of the light emitting device 100. Furthermore, when individually ON/OFF controlling the light emitting cells 30, the reflecting member can reduce the propagation of the light from a lit light emitting cell 30 to an adjacent light emitting cell 30. This can increase the difference between the luminance of a lit light emitting cell 30 and the luminance of an unlit light emitting cell when ON/OFF controlling the light emitting cells 30, thereby improving the contrast ratio of the light emitting element 10A.

For the reflecting member 130, for example, one made from a resin base material containing particles of a light reflecting substance can be used. For the resin, for example, silicone resins, modified silicone resins, epoxy resins, modified epoxy resins, acrylic resins, or hybrid resins containing at least one of these resins can be used. For the light reflecting substance, for example, titanium oxide, aluminum oxide, zinc oxide, barium carbonate, barium sulfate, boron nitride, aluminum nitride, glass filler, or the like can be suitably used. The reflecting member 130 may contain a light absorbing substance, such as carbon black, graphite, titanium black, or the like.

A light transmissive member which transmits the outgoing light from the light emitting element 10A may be disposed on the lower face of the substrate 11. In this case, the light emitted from the light emitting element 10A passes through the light transmissive member to be extracted primarily from the upper face of the light transmissive member. For the light transmissive member, one made from a resin or glass base material containing a wavelength conversion material that converts the wavelength of a portion of the light from the light emitting element 10A can be used. For the wavelength conversion material, for example, a phosphor can be used.

In the foregoing, light emitting elements and a light emitting device according to the present invention have been specifically described with reference to certain forms of implementing the present invention. The subject matter of the present invention, however, is not limited to those described above and must be broadly interpreted based on the scope of the claims. Needless to say, all forms achieved by way of various modifications and alterations based on the present disclosure also fall within the scope of the present invention.

What is claimed is:

1. A light emitting element comprising:

a first semiconductor layer;

a plurality of light emitting cells disposed on the first semiconductor layer along a first direction, each light emitting cell comprising:

an active layer, and a second semiconductor layer disposed on the active layer, wherein the plurality of light emitting cells include a first light emitting cell positioned in a center among the light emitting cells, and a plurality of second light emitting cells positioned around the first light emitting cell;

a first insulation layer continuously disposed over the light emitting cells and having a first opening provided above the first semiconductor layer located outward from the second light emitting cells in the first direction and a plurality of second openings located above the second semiconductor layer in each of the light emitting cells;

a first electrode disposed on the first insulation layer and electrically connected to the first semiconductor layer at the first opening; and a plurality of second electrodes, each positioned on and electrically connected to a respective one of the second semiconductor layers at a respective one of the second openings.

2. The light emitting element according to claim 1, wherein:

the first opening surrounds the light emitting cells in a top view.

3. The light emitting element according to claim 2, wherein:

the second openings located in the second light emitting cells are concentrated near the first light emitting cell.

4. The light emitting element according to claim 1, wherein:

the first electrode continuously covers the peripheral part of each of the light emitting cells.

5. The light emitting element according to claim 1, wherein:

the light emitting cells are arranged in a matrix along the first direction and a second direction orthogonal to the first direction; and in the first direction, a distance between two adjacent ones of the second openings located in the second light emitting cells is less than a distance between two adjacent ones of the second openings located in the first light emitting cell.

6. The light emitting element according to claim 5, wherein:

In the second direction, a distance between two adjacent ones of the second openings located in the second light emitting cells is less than a distance between two adjacent ones of the second openings located in the first light emitting cell.

7. The light emitting element according to claim 1, wherein:

the first electrode is electrically connected to the first semiconductor layer only at the first opening.

8. The light emitting element according to claim 2, wherein:

the first electrode is electrically connected to the first semiconductor layer only at the first opening.

9. The light emitting element according to claim 3, wherein:

the first electrode is electrically connected to the first semiconductor layer only at the first opening.

10. The light emitting element according to claim 4, wherein:

the first electrode is electrically connected to the first semiconductor layer only at the first opening.

11. The light emitting element according to claim 1, wherein:

a quantity of second openings provided in an individual one of the second light emitting cells is smaller than a quantity of second openings provided in the first light emitting cell.

12. The light emitting element according to claim 2, wherein:

a quantity of second openings provided in an individual one of the second light emitting cells is smaller than a quantity of second openings provided in the first light emitting cell.

13. The light emitting element according to claim 3, wherein:

a quantity of second openings provided in an individual one of the second light emitting cells is smaller than a quantity of second openings provided in the first light emitting cell.

14. The light emitting element according to claim 1, having a single first light emitting cell.

15. The light emitting element according to claim 2, having a single first light emitting cell.

16. The light emitting element according to claim 3, having a single first light emitting cell.

* * * * *